(12) United States Patent
Bershteyn et al.

(10) Patent No.: US 8,959,010 B1
(45) Date of Patent: Feb. 17, 2015

(54) EMULATION SYSTEM WITH IMPROVED RELIABILITY OF INTERCONNECT AND A METHOD FOR PROGRAMMING SUCH INTERCONNECT

(75) Inventors: Mikhail Bershteyn, Cupertino, CA (US); Mitchell G. Poplack, San Jose, CA (US); Viktor Salitrennik, Berkeley, CA (US)

(73) Assignee: Cadence Design Systems, Inc., San Jose, CA (US)

(*) Notice: Subject to any disclaimer, the term of this patent is extended or adjusted under 35 U.S.C. 154(b) by 313 days.

(21) Appl. No.: 13/315,161

(22) Filed: Dec. 8, 2011

(51) Int. Cl.
*G06F 9/455* (2006.01)

(52) U.S. Cl.
USPC .......................................................... 703/28

(58) Field of Classification Search
USPC .............................................. 703/23, 28, 14
See application file for complete search history.

(56) References Cited

U.S. PATENT DOCUMENTS

| | | |
|---|---|---|
| 4,306,286 A | 12/1981 | Cocke et al. |
| 4,459,694 A | 7/1984 | Ueno et al. |
| 4,695,740 A | 9/1987 | Carter |
| 4,695,999 A | 9/1987 | Lebizay |
| 4,697,241 A | 9/1987 | Lavi |
| 4,706,216 A | 11/1987 | Carter |
| 4,758,745 A | 7/1988 | Elgamal et al. |
| 4,829,202 A | 5/1989 | Austin |
| 4,845,633 A | 7/1989 | Furtek |
| 4,849,928 A | 7/1989 | Hauck |
| 4,870,302 A | 9/1989 | Freeman |
| 4,901,259 A | 2/1990 | Watkins |
| 4,914,612 A | 4/1990 | Beece et al. |
| 4,935,734 A | 6/1990 | Austin |
| 5,036,473 A | 7/1991 | Butts et al. |
| 5,109,353 A | 4/1992 | Sample et al. |
| 5,114,353 A | 5/1992 | Sample |
| 5,231,588 A | 7/1993 | Agrawal et al. |
| 5,233,539 A | 8/1993 | Agrawal et al. |
| 5,329,470 A | 7/1994 | Sample et al. |
| 5,352,123 A | 10/1994 | Sample et al. |
| 5,448,496 A | 9/1995 | Butts et al. |
| 5,448,522 A | 9/1995 | Huang |

(Continued)

OTHER PUBLICATIONS

Chang et al. ("Rapid Design and Analysis of Communication Systems Using the BEE Hardware Emulation Environment", 2003, IEEE).*

(Continued)

*Primary Examiner* — Omar Fernandez Rivas
*Assistant Examiner* — Iftekhar Khan
(74) *Attorney, Agent, or Firm* — Dickstein Shapiro LLP

(57) ABSTRACT

A method and apparatus for redundant communication channels in an emulation system is disclosed. A processor-based emulation system has a plurality of emulation chips on an emulation board. The emulation chips have a plurality of processor clusters. Signals are sent over one or more communication channels between processor clusters, including from a processor cluster on one emulation chip to a processor cluster on another emulation chip. Copies of the same signal may be sent in duplicate over separate communication channels. If a communication channel failure is detected, instruction memory is modified so that a processor cluster's instructions no longer address a first cluster memory location, but instead address a second cluster memory location of a non-failed communication channel. By using redundant communication channels, emulation system interconnect reliability is increased and recompilation of the design under verification may be avoided.

21 Claims, 8 Drawing Sheets

(56) References Cited

U.S. PATENT DOCUMENTS

| | | | |
|---|---|---|---|
| 5,452,231 | A | 9/1995 | Butts et al. |
| 5,452,239 | A | 9/1995 | Dai et al. |
| 5,475,830 | A | 12/1995 | Chen et al. |
| 5,477,475 | A | 12/1995 | Sample et al. |
| 5,530,958 | A | 6/1996 | Agarwal et al. |
| 5,544,069 | A | 8/1996 | Mohsen |
| 5,551,013 | A | 8/1996 | Beausoleil et al. |
| 5,563,829 | A | 10/1996 | Huang |
| 5,572,710 | A | 11/1996 | Asano et al. |
| 5,574,388 | A | 11/1996 | Barbier et al. |
| 5,596,742 | A | 1/1997 | Agarwal et al. |
| 5,612,891 | A | 3/1997 | Butts et al. |
| 5,649,176 | A | 7/1997 | Selvidge et al. |
| 5,659,716 | A | 8/1997 | Selvidge et al. |
| 5,960,191 | A | 9/1999 | Sample et al. |
| 6,020,760 | A | 2/2000 | Sample et al. |
| 6,035,117 | A | 3/2000 | Beausoleil et al. |
| 6,051,030 | A | 4/2000 | Beausoleil et al. |
| 6,058,492 | A | 5/2000 | Sample et al. |
| 6,285,211 | B1 | 9/2001 | Sample et al. |
| 6,289,494 | B1 | 9/2001 | Sample et al. |
| 6,377,911 | B1 | 4/2002 | Sample et al. |
| 6,377,912 | B1 | 4/2002 | Sample et al. |
| 6,618,698 | B1 | 9/2003 | Beausoleil et al. |
| 6,694,464 | B1 | 2/2004 | Quayle et al. |
| 6,842,729 | B2 | 1/2005 | Sample et al. |
| 6,850,880 | B1 | 2/2005 | Beausoleil et al. |
| 6,901,359 | B1 | 5/2005 | Beausoleil et al. |
| 7,043,417 | B1 | 5/2006 | Beausoleil et al. |
| 7,047,179 | B2 | 5/2006 | Beausoleil et al. |
| 7,107,203 | B1 | 9/2006 | Beausoleil et al. |
| 7,555,423 | B2 | 6/2009 | Beausoleil et al. |
| 7,606,698 | B1 | 10/2009 | Elmufdi et al. |
| 7,721,036 | B2 | 5/2010 | Poplack et al. |
| 7,725,304 | B1 | 5/2010 | Beausoleil et al. |
| 7,738,398 | B2 | 6/2010 | Quayle et al. |
| 7,739,094 | B1 | 6/2010 | Poplack et al. |
| 7,739,097 | B2 | 6/2010 | Sample et al. |
| 7,792,933 | B2 | 9/2010 | Butts et al. |
| 7,827,023 | B2 | 11/2010 | Beausoleil et al. |
| 7,904,288 | B1 | 3/2011 | Beausoleil et al. |
| 7,908,465 | B1 | 3/2011 | Poplack et al. |
| 7,958,513 | B2 * | 6/2011 | Jia et al. ............ 719/313 |
| 8,027,828 | B2 | 9/2011 | Bershteyn et al. |
| 8,090,568 | B2 | 1/2012 | Beausoleil et al. |
| 2005/0015460 | A1 * | 1/2005 | Gole et al. ............ 709/213 |
| 2013/0054966 | A1 * | 2/2013 | Clay ............ 713/168 |

OTHER PUBLICATIONS

J. Babb, et al. Virtual Wires; Overcoming Pin Limitations in FPGA-based Logic Emulators; MIT Laboratory for Computer Science.

Agrawal, et al. "MARS: A Multiprocessor-Based Programmable Accelerator", IEEE Design & Test Computers, Oct. 1987, pp. 28-36.

Manning "An Approach to Highly Integrated, Computer-Maintained Cellular Arrays", IEEE Transactions on Computers, vol. C-26, Jun. 1977, pp. 536-552.

Manning, Automatic Test, Configuration, and Repair of Cellular Arrays, Doctoral Thesis MAC TR-151 (MIT), Jun. 1975.

Shoup, Programmable Cellular Logic Arrays, Doctoral Thesis (Carnegie-Mellon University; DARPA contract No. F44620-67-C0058), Mar. 1970.

Shoup, Programmable Cellular Logic, undated, pp. 27-28.

Wynn, "In-Circuit Emulation for ASIC-Based Designs" VLSI Systems Design, Oct. 1986, pp. 38-45.

Sami, et al. Reconfigurable Architectures for VLSI Processing Arrays, AFIPS Conference Proceedings, 1983 National Computer Conference, May 16-19, 1983, pp. 565-577.

Beece et al., The IBM Engineering Verification Engine, 25th ACM/IEEE Design Automation Conference, Paper 17.1, 1988 pp. 218-224.

Pfister, The Yorktown Simulation Engine: Introduction, 19th Design Automation Conference, Paper 7.1 1982, pp. 51-54.

Denneau, The Yorktown Simulation Engine, 19tth Design Automation Conference, Paper 7.2, 1982, pp. 55-59.

Kronstadt, et al., Software Support for the Yorktown Simulation Engine, 19th Design Automation Conference, Paper 7.3, 1982, pp. 60-64.

Koike, et al., HAL: A High-Speed Logic Simulation Machine, IEEE Design & Test, Oct. 1985, pp. 61-73.

Shear, Tools help you retain the advantages of using breadboards in gate-array design, EDN, Mar. 18, 1987, pp. 81-88.

Beresford, An Emulator for CMOS ASICS, VLSI Systems Design, May 4, 1987, p. 8.

Mentor Graphics Corp., Gate Station User's Manual, 1987, (excerpts).

Mentor Graphics Corp., Technology Definition Format Reference Manual, 1987, (excerpts).

Chen, Fault-Tolerant Wafer Scale Architectures Using Large Crossbar Switch Arrays, excerpt from Jesshope, et al., Wafer Scale Integration, A. Hilger, 1986, pp. 113-124.

Kung, Why Systolic Architectures?, Computer, Jan. 1982, pp. 37-46.

Hedlund, Wafer Scale Integration of Parallel Processors, Doctoral Thesis (Purdue University; Office of Naval Research Contracts N00014-80-K-0816 & N00014-81-K-0360) 1982.

Goossens, et al., A Computer-Aided Design Methodology for Mapping DSP-Algorithms onto Custom Multi-Processing Architectures, IEEE 1986, pp. 924-925.

Schmitz, Emulation of VLSI Devices Using LCAs, VLSI systems Design, May 20, 1987, pp. 54-62.

Gate Station Reference Manual, Mentor Graphics Corp., 1987 (excerpts).

Abramovici, et al., A Logic Simulation Machine, 19th Design Automation Conference, Paper 7.4, 1982, pp. 65-73.

Beresford, Hard Facts, Soft ASICS, VLSI Systems Design, Dec. 1986 p. 8.

Spandorfer, Synthesis of Logic Functions on an Array of Integrated Circuits, Contract Report AFCRI-66-298, Oct. 31, 1965.

Wagner, The Boolean Vector Machine, ACM SIGARCH, 1983, pp. 59-66.

Wynn, Designing with Logic Cell Arrays, ELECTRO/87 and Mini/Micro Northeast Conference Record, 1987.

* cited by examiner

EMULATION SYSTEM WITH IMPROVED RELIABILITY OF INTERCONNECT AND A METHOD FOR PROGRAMMING SUCH INTERCONNECT

FIELD

The present patent document relates generally to a processor-based hardware emulation system. In particular, the present patent document and relates to a method and system for improving the reliability of interconnect in processor-based hardware emulation systems.

BACKGROUND

Hardware emulators are programmable devices used to verify hardware designs and integrated circuits having very high logic densities (e.g., large numbers of logic gates). A common method of design verification is to use processor-based hardware emulators to emulate the design prior to physically manufacturing the integrated circuit(s) of the hardware. These processor-based emulators sequentially evaluate combinatorial logic levels in the design under verification, starting at the inputs and proceeding to the outputs. Each pass through the entire set of logic levels is known as a cycle; the evaluation of each individual logic level is known as an emulation step.

An exemplary hardware emulator is described in commonly assigned U.S. Pat. No. 6,618,698 entitled "Clustered Processors In An Emulation Engine," which is hereby incorporated by reference in its entirety. Hardware emulators allow engineers and hardware designers to test and verify the operation of an integrated circuit, an entire board of integrated circuits, or an entire system without having to first physically fabricate the hardware.

The complexity and number of logic gates present on an integrated circuit increases significantly every year. In order to emulate such large (e.g., high gate count) integrated circuits, processor-based hardware emulators now commonly contain hundreds of thousands of processors that must efficiently communicate in the process of emulating the design under verification.

The hardware emulator's processors are generally arranged into groups of processors known as clusters. In a conventional processor-based hardware emulator, each processor cluster has a memory, and each processor in a cluster can access the common area of the shared memory. The processors address the shared memory via an instruction word that is stored in a special instruction memory. This instruction word contains a read address for the data to be evaluated and a Boolean function table that instructs the processor how to evaluate the data. After evaluation, the processor stores the produced result back to the same memory location as indicated by the instruction address.

The amount of memory required by a conventional hardware emulator is directly dependent on the number of processors present in the hardware emulator. Specifically, the hardware emulator must contain memory that is at least equal to the number of processors multiplied by the depth of the instruction memory. The instruction word must contain several address fields to enable the processor to address any location within the memory.

Whenever the evaluation process for the design under verification requires that the processor which belongs to one cluster operates upon the data produced by a processor which belongs to another cluster, such data needs to be first transferred from the shared memory unit of the processors in the producing, or source, cluster to the shared memory unit of the processors in the consuming, or destination, cluster. In some embodiments of a processor-based emulation system, there are as many as 8 processors in a cluster. In other embodiments there are as few as 4 processors. This means that in an emulator system comprised of hundreds of thousands of processors must contain tens of thousands or hundreds of thousands of clusters, interconnected with communication channels.

The communication channels between clusters can be of different physical nature: some may be implemented in silicon die; some in the substrate of a multi-chip module; some in a printed circuit board; and some using electrical or optical cables. Various implementations of communication channels have different degrees of reliability commonly characterized by mean time between failures (MTBF). Commonly, those communication channels implemented on a silicon die exhibit a high degree of reliability, while cable connections are less reliable.

Replacement of a component causing failure of a communication channel, even when possible, requires service action and causes system downtime, thereby increasing the cost of ownership of the emulation system. One way to reduce the frequency of service and maintain system reliability that is known in the prior art is to make a list of failed communication channels, which list is available to the compiler software that maps the design under verification to the emulation system. Based on the information provided by the list, the compiler can avoid failed channels by using alternative routes to pass information between clusters. However, each time a new failed channel is detected, various designs under verification in the system must be recompiled to use the alternative routes. This effectively causes down time of the verification process until recompilation is complete. For the customers owning several emulation systems, such failure or defect maps create asymmetries such that a design compiled for one emulation system can no longer be used with the other emulation systems.

Thus, there is a need in the art for hardware emulation systems with increased reliability of interconnect in view of communication channel failures.

SUMMARY

A method and apparatus for redundant communication channels to increase the reliability of interconnect in an emulation system is disclosed. A first aspect of the method comprises the steps of receiving a first copy of data at a first processor cluster over a first communication channel, receiving a second copy of data at said first processor cluster over a second communication channel, storing a first instruction in a memory of said first processor cluster, said instruction controlling the selection of a communication channel, examining a list of failed communication channels, and modifying said first instruction to select data received from a working communication channel.

In another aspect of the method said first instruction controls the selection of a communication channel by addressing the memory location of one of said first and second copies of data, said first instruction is modified to address the memory location of the copy of data received over a working communication channel, and the method further comprising the step of storing said first copy of data and said second copy of data in separate locations in a memory of said first processor cluster.

In another aspect of the method said first instruction controls the selection of a communication channel by specifying a control field selecting one of a plurality of communication channel inputs to a multiplexer, wherein said first instruction is modified to select one of said plurality of multiplexer inputs associated with a working communication channel.

Another aspect of the method comprises the step of receiving a third copy of data at a second processor cluster over a third communication channel, receiving a fourth copy of data at a second processor cluster over a fourth communication channel, storing a second instruction in a memory of said second processor cluster, said second instruction addressing the memory location of the first copy of data, modifying said second instruction to select data received from a working communication channel, and copying one of said third copy of data and said fourth copy of data to create said first and second copies of data.

In another aspect of the method, said second instruction controls the selection of a communication channel by addressing the memory location of one of said third and fourth copies of data, said second instruction is modified to address the memory location of the copy of data received over a working communication channel, and further comprises the step of storing said third copy of data and said fourth copy of data in separate locations in a memory of said second processor cluster.

In another aspect of the method, said second instruction controls the selection of a communication channel by specifying a control field selecting one of a plurality of communication channel inputs to a multiplexer, and said second instruction is modified to select one of said plurality of multiplexer inputs associated with a working communication channel.

Another aspect of the method is compiling an integrated circuit design comprising selecting a source processor cluster, selecting a destination processor cluster, selecting a first sequence of communication elements of an emulation system, including a first set of one or more communication channels, said first sequence of communication elements connecting said source processor cluster to said destination processor cluster, identifying a second sequence of communication elements of an emulation system, including a second set of one or more communication channels, said second sequence of communication elements connecting said source processor cluster to a destination processor cluster, scheduling a transfer of a first copy of data over said first sequence of communication elements and a second copy of the same data over said second sequence of communication elements, until both the first and second copies of data reside in separate locations in a memory of the destination processor cluster, and scheduling an instruction that uses the transferred first and second copies of data after both copies have been scheduled to arrive at said destination processor cluster.

In another aspect of the method said first sequence of communication elements comprises a first communication channel, a third communication channel, and a first intermediate processor cluster, said first intermediate processor to receive said first copy of data from said first communication channel and to transmit said first copy of data to said third communication channel, and said second sequence of communication elements comprises a second communication channel, a fourth communication channel, and a second intermediate processor cluster, said second intermediate processor to receive a second copy of data from said second communication channel and to transmit said second copy of data to said fourth communication channel.

In another aspect of the method said first sequence of communication elements comprises a first communication channel, a third communication channel, and a first programmable switch, said first programmable switch to receive said first copy of data from said first communication channel and to transmit said first copy of data to said third communication channel, and said second sequence of communication elements comprises a second communication channel, a fourth communication channel, and said programmable switch, said programmable switch to receive a second copy of data from said second communication channel and to transmit said second copy of data to said fourth communication channel.

In another aspect of the method said first sequence of communication elements comprises a first communication channel, a third communication channel, and a first intermediate processor cluster to receive a third copy of data from said first communication channel and to transmit said first copy of data to said third communication channel, and said second sequence of communication elements comprises a second communication channel, a fourth communication channel, and a second intermediate processor cluster to receive a fourth copy of data from said second communication channel and to transmit said second copy of data to said fourth communication channel, and further comprises the steps of scheduling a transfer of a third copy of data over said third communication channel and a transfer of a fourth copy of the same data over said fourth communication channel, until both the third and fourth copies of data reside in separate locations in memory space of the same intermediate processor cluster, and scheduling the selection of one of the third and fourth copies of data for copying to create said first and second copies of data after both the third and fourth copies have been scheduled to arrive at said intermediate processor cluster.

A first aspect of the apparatus comprises a plurality of emulation chips having processor clusters, a first processor cluster of a first emulation chip, a second processor cluster of a second emulation chip, a set of two or more communication channels, each communication channel of said set of communication channels for carrying one duplicate signal of a set of duplicate signals from said first processor cluster for receipt by said second processor cluster, and a memory of said second processor cluster, for storing said received set of duplicate signals, each duplicate signal having an address in said memory, and for storing an instruction addressing fewer than all of said duplicate signals having an address in said memory.

In another aspect of the apparatus said set of communication channels comprises a first communication channel carrying a first duplicate signal and a second communication channel carrying a second duplicate signal, and said instruction stored in said memory addresses one of the set of said first duplicate signal and said second duplicate signal.

Another aspect of the apparatus comprises a third processor cluster of a third emulation chip for receiving said first duplicate signal from said first processor cluster over a first portion of said first communication channel and for transmitting said first duplicate signal to said second processor signal over a second portion of said first communication channel, and a fourth processor cluster of said third emulation chip for receiving said second duplicate signal from said first processor cluster over a first portion of said second communication channel and for transmitting said second duplicate signal to said second processor signal over a second portion of said first communication channel.

Another aspect of the apparatus comprises a third processor cluster of a third emulation chip, a second set of two or more communication channels, each communication channel of said second set of communication channels for carrying a duplicate signal of a second set of duplicate signals from said third processor cluster for receipt by said first processor cluster, and a memory of said first processor cluster for storing said received second set of duplicate signals, each duplicate signal having an address in said memory of said first processor, and for storing an instruction addressing fewer than all of said duplicate signals having an address in said memory, and wherein each duplicate signal of said set of duplicate signals transmitted from said first processor cluster is a copy of one duplicate signal of said second set of duplicate signals stored in said first processor memory.

Another aspect comprises a computer-readable non-transitory storage medium having stored thereon a plurality of instructions, said plurality of instructions when executed by a computer, cause said computer to perform, receiving a first copy of data at a first processor cluster over a first communication channel, receiving a second copy of data at said first processor cluster over a second communication channel, storing a first instruction in a memory of said first processor cluster, said instruction controlling the selection of a communication channel, examining a list of failed communication channels, and modifying said first instruction to select data received from a working communication channel.

In another aspect said first instruction controls the selection of a communication channel by addressing the memory location of one of said first and second copies of data, said first instruction is modified to address the memory location of the copy of data received over a working communication channel, and further causes said computer to perform storing said first copy of data and said second copy of data in separate locations in a memory of said first processor cluster.

In another aspect said first instruction controls the selection of a communication channel by specifying a control field selecting one of a plurality of communication channel inputs to a multiplexer, and said first instruction is modified to select one of said plurality of multiplexer inputs associated with a working communication channel.

In another aspect said computer further performs receiving a third copy of data at a second processor cluster over a third communication channel, receiving a fourth copy of data at a second processor cluster over a fourth communication channel, storing a second instruction in a memory of said second processor cluster, said second instruction addressing the memory location of the first copy of data, modifying said second instruction to select data received from a working communication channel, and copying one of said third copy of data and said fourth copy of data to create said first and second copies of data.

In another aspect said second instruction controls the selection of a communication channel by specifying a control field selecting one of a plurality of communication channel inputs to a multiplexer, and said second instruction is modified to select one of said plurality of multiplexer inputs associated with a working communication channel.

Another aspect comprises a computer-readable non-transitory storage medium having stored thereon a plurality of instructions, said plurality of instructions when executed by a computer, cause said computer to perform selecting a source processor cluster, selecting a destination processor cluster, selecting a first sequence of communication elements of an emulation system, including a first set of one or more communication channels, said first sequence of communication elements connecting said source processor cluster to said destination processor cluster, identifying a second sequence of communication elements of an emulation system, including a second set of one or more communication channels, said second sequence of communication elements connecting said source processor cluster to a destination processor cluster, scheduling a transfer of a first copy of data over said first sequence of communication elements and a second copy of the same data over said second sequence of communication elements, until both the first and second copies of data reside in separate locations in a memory of the destination processor cluster, and scheduling an instruction that uses the transferred first and second copies of data after both copies have been scheduled to arrive at said destination processor cluster.

In another aspect said first sequence of communication elements comprises a first communication channel, a third communication channel, and a first intermediate processor cluster, said first intermediate processor to receive said first copy of data from said first communication channel and to transmit said first copy of data to said third communication channel, and said second sequence of communication elements comprises a second communication channel, a fourth communication channel, and a second intermediate processor cluster, said second intermediate processor to receive a second copy of data from said second communication channel and to transmit said second copy of data to said fourth communication channel.

In another aspect said first sequence of communication elements comprises a first communication channel, a third communication channel, and a first programmable switch, said first programmable switch to receive said first copy of data from said first communication channel and to transmit said first copy of data to said third communication channel, and said second sequence of communication elements comprises a second communication channel, a fourth communication channel, and said programmable switch, said programmable switch to receive a second copy of data from said second communication channel and to transmit said second copy of data to said fourth communication channel.

In another aspect said first sequence of communication elements comprises a first communication channel, a third communication channel, and a first intermediate processor cluster to receive a third copy of data from said first communication channel and to transmit said first copy of data to said third communication channel, and said second sequence of communication elements comprises a second communication channel, a fourth communication channel, and a second intermediate processor cluster to receive a fourth copy of data from said second communication channel and to transmit said second copy of data to said fourth communication channel, and further causes said computer to perform scheduling a transfer of a third copy of data over said third communication channel and a transfer of a fourth copy of the same data over said fourth communication channel, until both the third and fourth copies of data reside in separate locations in memory space of the same intermediate processor cluster, and scheduling the selection of one of the third and fourth copies of data for copying to create said first and second copies of data after both the third and fourth copies have been scheduled to arrive at said intermediate processor cluster.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles of the present invention.

Figure 1:
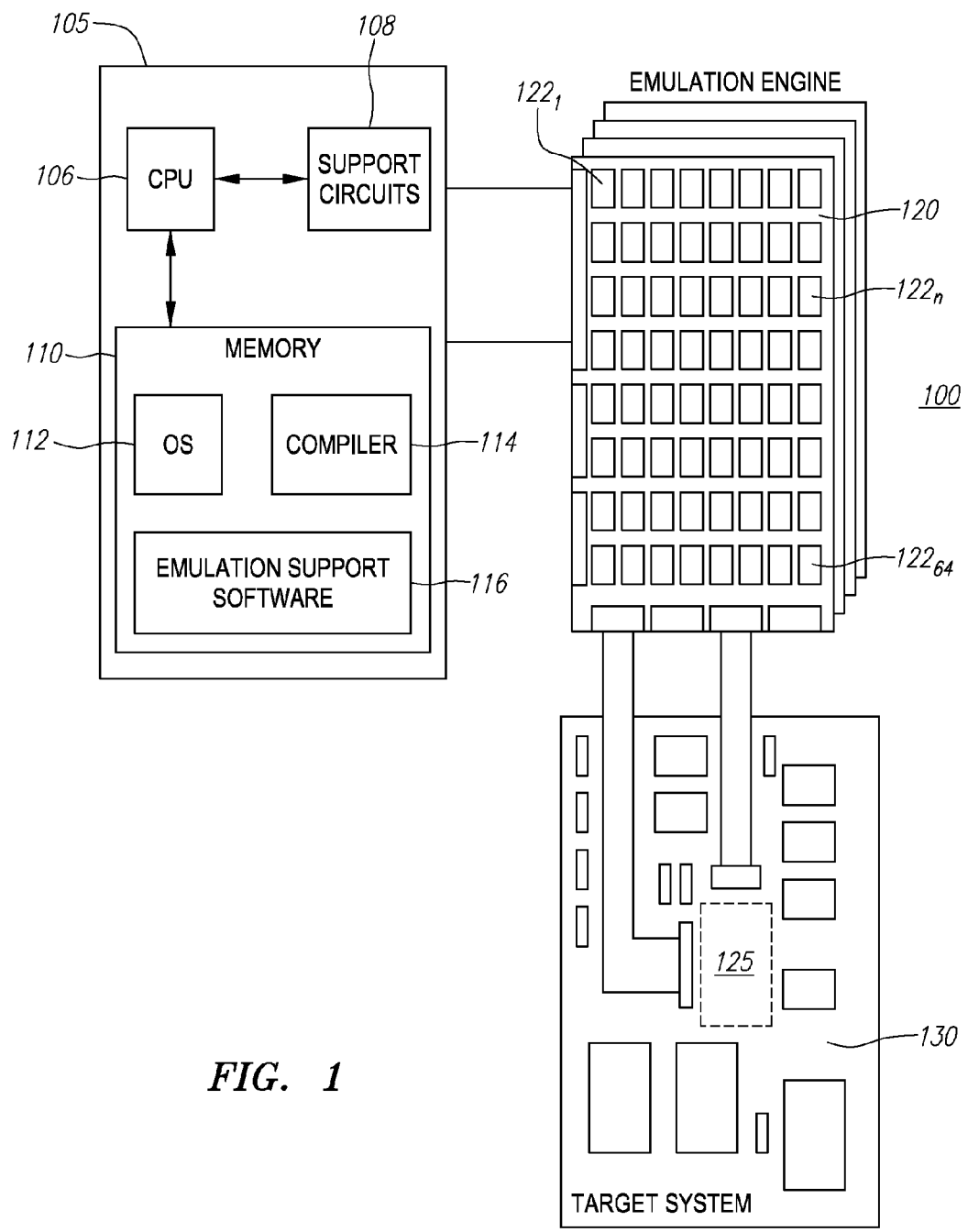
FIG. 1 is an illustration of a processor-based hardware emulation system.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for redundant communication channels to increase the reliability of an emulation system is disclosed. Exemplary emulation systems are disclosed in U.S. Pat. No. 6,618,698 "Clustered Processors In An Emulation Engine" and U.S. Pat. No. 5,551,013 "Multiprocessor For Hardware Emulation," which are hereby incorporated by reference in their entirety.

Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

FIG. 1 depicts an overview of an emulation system 100. The system comprises a computer workstation 105, an emulation engine including emulation board 120, and a target system 130.

The computer workstation 105 provides emulation support facilities to the emulation engine 100 and emulation board 120. The computer workstation 105, for example a personal computer, comprises at least one central processing unit (CPU) 106, support circuits 108, and a memory 110. The CPU 106 may comprise one or more conventionally available microprocessors and/or microcontrollers. The support circuits 108 are well known circuits that are used to support the operation of the CPU 106. These supporting circuits comprise power supplies, clocks, input/output interface circuitry, cache, and other similar circuits.

Memory 110, sometimes referred to as main memory, may comprise random access memory, read only memory, disk memory, flash memory, optical storage, and/or various combinations of these types of memory. Memory 110 may in part be used as cache memory or buffer memory. Memory 110 stores various forms of software and files for the emulation system, such as an operating system (OS) 112, a compiler 114, and emulation support software 116.

The compiler 114 converts a hardware design, such as hardware described in VHDL or Verilog, to a sequence of instructions that can be evaluated by the emulation board 120.

The computer workstation 105 allows a user to interface with the emulation engine 100, including emulation board 120, and control the emulation process and collect emulation results for analysis. Under control of the computer workstation 105, programming information and data is loaded to the emulation engine 100. The emulation board 120 has on it a number of individual emulation chips, for example the 64 emulation chips $122_1$ to $122_{64}$ (collectively 122) shown in FIG. 1, in addition to miscellaneous support circuitry.

In response to programming received from the emulation support software 116, emulation engine 100 emulates a portion 125 of the target system 130. Portion 125 of the target system 130 may be an integrated circuit, a memory, a processor, or any other object or device that may be emulated in a programming language. Exemplary emulation programming languages include Verilog and VHDL.

Figure 2:
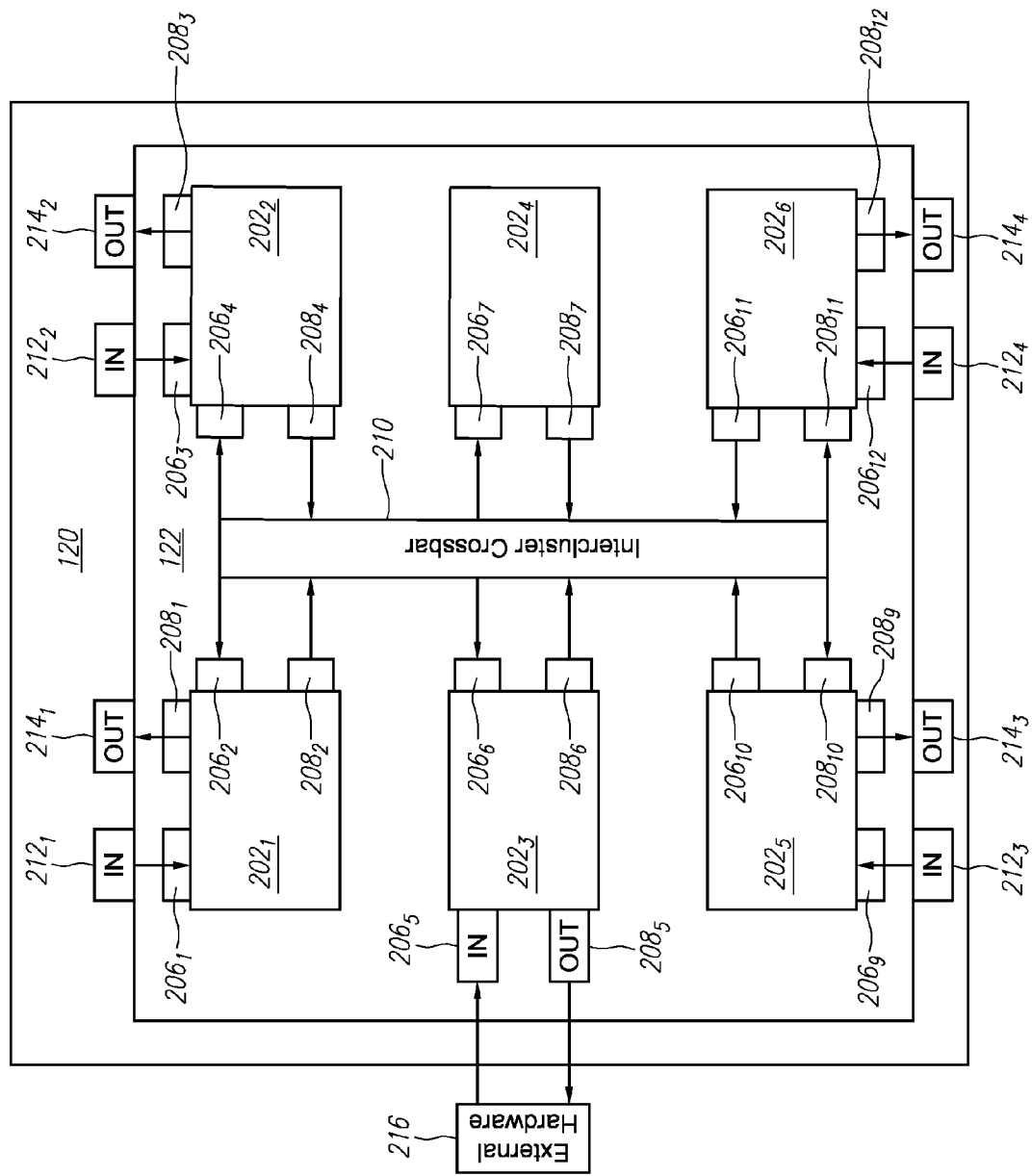
FIG. 2 is an illustration of a processor-based hardware emulation chip.

FIG. 2 depicts an expanded view of an emulation chip 122 utilized by emulation board 120 of emulation engine 100. Emulation chip 122 of FIG. 2 is an exemplary emulation chip of emulation board 120. Emulation chip 122 comprises processor clusters $202_1$ to $202_6$ (collectively 202) capable of communicating with each other via an intercluster crossbar 210. Each cluster 202 has at least one input 206 and at least one output 208. Input 206 and output 208 allows a cluster 202 to communicate with other processor clusters 202 via the intercluster crossbar 210, other emulation chips via external connectors 212 and 214, and external hardware 216. The external hardware 216 may be a VLSI circuit, a debugger, a memory, or any combination of hardware and software in communication with emulation chip 122. The emulation chip 122 has input connectors $212_1$ to $212_4$ (collectively 212) for receiving data from other emulation chips and output connectors $214_1$ to $214_4$ (collectively 214) for supplying data to other emulation chips. Input connectors 212 and output connectors 214 are known as chip pads.

For emulation chip 122, cluster $202_1$ has input connectors $206_1$ and $206_2$. Cluster $202_1$ may receive signals at input connector $206_2$ from any of clusters $202_2$ to $202_6$ via intercluster crossbar 210. Cluster $202_1$ may likewise receive signals at input connector $206_1$ from clusters of other emulation chips of emulation board 120 via external input connector $212_1$. Cluster $202_1$ likewise has output connectors $208_1$ and $208_2$. Cluster $202_1$ may send signals from output connector $208_2$ to any of clusters $202_2$ to $202_6$ of emulation chip 122 via intercluster crossbar 210. Cluster $202_1$ may likewise send signals from output connector $208_1$ to processor clusters on other emulation chips of emulation board 120 via external output connector $214_1$.

Cluster $202_3$ of emulation chip 122 may send signals to external hardware 216 using output connector $208_5$ and may receive signals from external hardware 216 using input connector $206_5$. Cluster $202_3$ may also receive signals at input connector $206_5$ from any of clusters $202_1$, $202_2$, or $202_4$ to $202_6$ via intercluster crossbar 210. Likewise, cluster $202_3$ may receive send signal from output connector $208_2$ to any of clusters $202_1$, $202_2$, or $202_4$ to $202_6$ of emulation chip 122 via intercluster crossbar 210.

FIG. 2 illustrates six processor clusters 202 of emulation chip 122, having a particular connectivity and arrangement of inputs and outputs. It is to be understood that the number of clusters, connectivity, and arrangement of inputs and outputs may vary. For example, in certain embodiments, the number of clusters 202 per emulation chip 122 is commonly in the range from sixty four to ninety six clusters, but need not be so limited.

Figure 3:
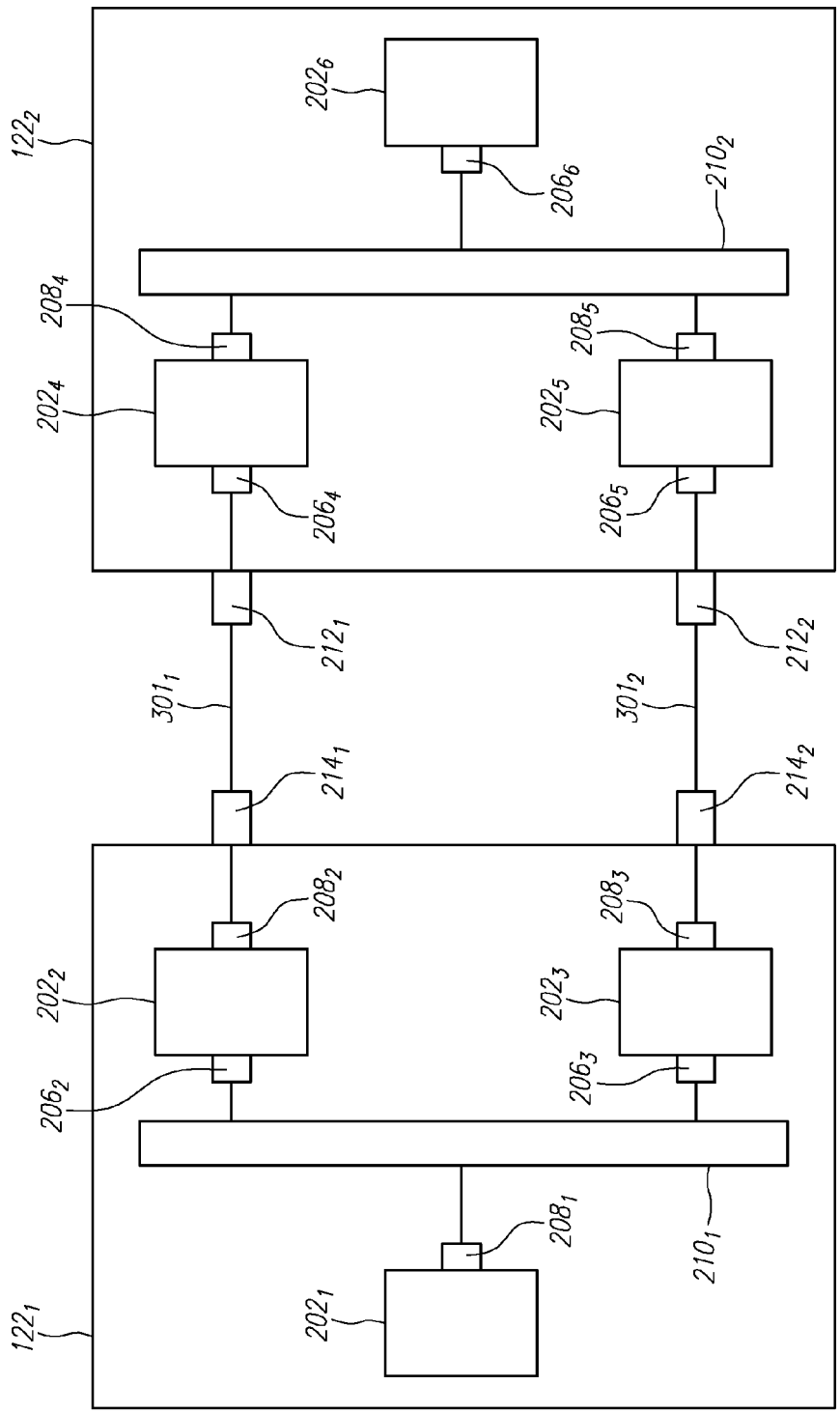
FIG. 3 is an illustration of two emulation chips having a plurality of direct connections, according to one embodiment.

FIG. 3 depicts a communication scheme between processor clusters located in emulation chips that have a plurality of direct connections. It is to be understood that, for clarity, only discussed elements of the emulation chips $122_1$ and $122_2$ are shown in FIG. 3. A signal (i.e., a logic level produced by a logic gate that is part of the design under test) is computed in source cluster $202_1$ located in emulation chip $122_1$, destined for consumption (i.e., input to a logic gate of the design under test) in destination cluster $202_6$ located in emulation chip $122_2$. There are at least two communication channels $301_1$ and $301_2$ capable of delivering data from chip $122_1$ to chip $122_2$.

The emulation system is programmed to deliver a primary signal over communication channel $301_1$, as well as a copy of the primary signal over communication channel $301_2$. It does not matter which of the two communication channels carries the primary signal and which communication channel carries the copy of that signal. The primary signal is delivered from source cluster $202_1$ to cluster $202_2$ via output connector $208_1$, intercluster crossbar $210_1$, and input connector $206_2$. From there, the primary signal is delivered to cluster $202_4$ in destination emulation chip $122_2$ via communication channel $301_1$. Communication channel $301_1$ connects cluster $202_2$ in emulation chip $122_1$ using its output $208_2$ and external output connection $214_1$ with cluster $202_4$ in chip emulation $122_2$ using its input $206_4$ and external input connection $212_1$. Through output connector $208_4$, intercluster crossbar $210_2$, and input connector $206_8$, the primary signal is finally delivered to the destination cluster $202_6$. Additionally, a copy of the primary signal is delivered from source cluster $202_1$ to destination cluster $202_6$, but now via communication channel $301_2$. The copy is delivered from source cluster $202_1$ to cluster $202_3$ via output connector $208_1$, intercluster crossbar $210_1$, and input connector $206_3$. From there, the copy is delivered to cluster $202_5$ in destination emulation chip $122_2$ via communication channel $301_2$. Communication channel $301_2$ connects cluster $202_3$ in chip $122_1$ using its output $208_3$ and external output connection $214_2$ with cluster $202_5$ in emulation chip $122_2$ using its input $206_5$ and external input connection $212_2$. Through output connector $208_5$, intercluster crossbar $210_2$, and input connector $206_8$, the copy is finally delivered to the destination cluster $202_6$.

FIG. 3 shows a case where source cluster $202_1$ and destination cluster $202_6$ are not the ones that are connected to any of the communication channels used for signal transmission. In an alternative embodiment, one or both of these clusters have connection to the communication channels $301_1$ (clusters $202_2$ and $202_4$) or $301_2$ (clusters $202_3$ and $202_5$).

FIGS. 6A-6B show embodiments for selecting a signal copy from the local memory of a processor cluster and dynamically modifying instruction 603. In the embodiment shown in FIG. 6A, each copy of the data signal transmitted from the source cluster is stored in one of two different locations, $602_1$ and $602_2$, of the memory 601 shared between the processors in cluster $202_6$. The instruction 603 prepared for execution by one of the processors in destination cluster $202_6$ contains operation code 604, a plurality of operand addresses $605_1$, $605_2$, $605_3$, $605_4$, and a crossbar control field 606. One of the operands, for example $605_2$, indicates a signal transmitted from the source cluster $202_6$ as shown in FIG. 3. Initially, during the process of compiling the design under verification, the operand address is generated to indicate one of the copies $602_1$ of a signal that is transmitted over communication channel $301_1$ as shown with the solid arrow. The second copy $602_2$ that is transmitted over communication channel $301_2$ is not used. However, should the support software detect that channel $301_1$ has in fact failed, the emulation support software 116 will modify operand $605_2$ such that operand $605_2$ contains the address of location $602_2$ as shown with dotted arrow. After that, the emulation system can continue to operate normally notwithstanding the failure of communication channel $301_1$ and without essential recompilation of the design under verification.

In FIG. 6B an alternative method of selecting a signal copy is depicted. This method uses modification of crossbar control field 606 of the instruction 603. This field contains a value that controls multiplexer 607 which is a part of intercluster crossbar 210 that delivers a signal to the cluster where instruction 603 is executed. Initially, during the process of compiling design under verification, this value is set to indicate acquisition of signal copy that is transmitted over communication channel $301_1$ through cluster $202_4$ in FIG. 3. The second copy $602_2$ that is transmitted over communication channel $301_2$ is not used. However, should it become known that channel $301_1$ has in fact failed, field 606 shall be changed so that it indicates acquisition of the signal copy that is transmitted over communication channel $301_2$ via cluster $202_5$ in FIG. 3.

In implementation, the compiler 114 can choose one of the methods shown in FIG. 6A or 6B as necessary for each signal transmitted over unreliable communication channel.

Figure 4:
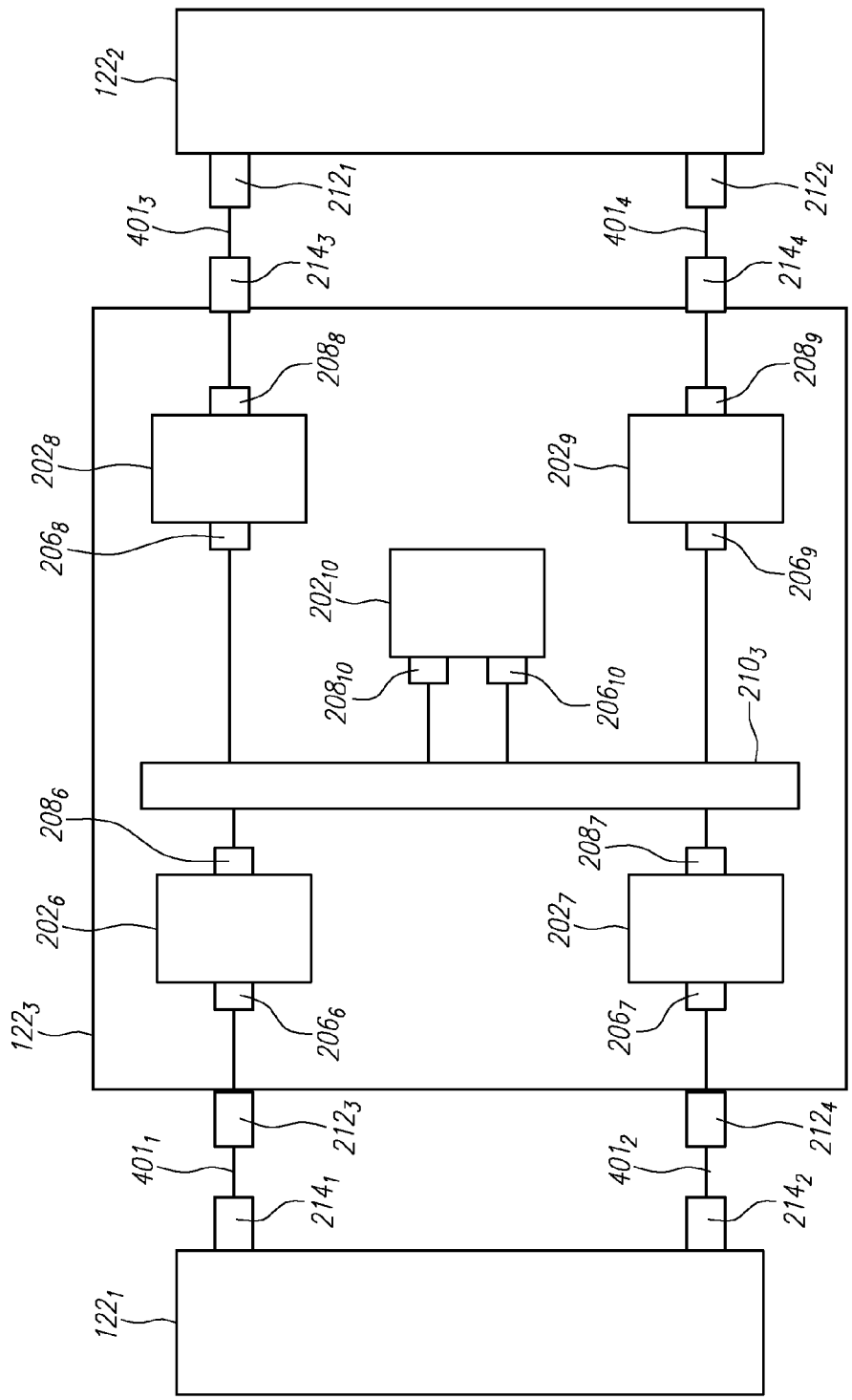
FIG. 4 is an illustration of three emulation chips, the first and second emulation chips having a plurality of direct connections and the second and third emulation chips having a plurality of direct connections, according to one embodiment.

FIG. 4 depicts a communication scheme between processor clusters located in emulation chips $122_1$ and $122_2$ that do not have any communication channels directly between them that are available for transmission of a given signal, either because no such communication channels exist, or there is another important reason to not use the communication channels. Such reasons not to use the communication channels may include that they are already taken by other signals, the queue for them is too long, or any other circumstance degrading model performance to the extent that their use is undesirable. Instead, there is an intermediate emulation chip $122_3$ that has communication channels to both source emulation chip $122_1$ and destination emulation chip $122_2$. Note that FIG. 4 does not show the internal circuit blocks of source chip $122_1$ and destination chip $122_2$ because they are similar to those shown in FIG. 3. A primary signal of data generated by the source processor cluster and a copy of that signal are generated in the source cluster of source emulation chip $122_1$. The primary signal is transmitted through external output connection $214_1$ of emulation chip $122_1$ and communication channel $401_1$ to the intermediate emulation chip $122_3$ through external input connection $212_3$. The primary signal is acquired by cluster $202_6$ through its input $206_6$. From there, the primary signal is forwarded through output connector $208_6$ of cluster $202_6$ and intercluster crossbar $210_3$ to cluster $202_{10}$ through its input $206_{10}$. The copy of the primary signal is also transferred to cluster $202_{10}$, but is instead transferred via external output connection $214_2$ of emulation chip $122_1$, communication channel $401_2$, and external input connection $212_4$, input connector $206_7$, cluster $202_7$, output connector $208_7$, interconnect crossbar $210_3$, and input connector $206_{10}$ of intermediate emulation chip $122_3$.

After receipt of the primary signal and the copy by cluster $202_{10}$, one of the processors in this cluster executes an instruction 603 as shown in FIG. 6A. This instruction performs a copy of a value of a single operand. As described above in the discussion of FIG. 6A, the address of this operand, for example operand $605_2$, initially indicates the location of the copy of the first signal that was transmitted over communication channel $401_1$ and stored in the memory of cluster $202_{10}$ at location $602_1$. Should channel $401_1$ be determined to be failed, the address $605_2$ of operand $605_2$ is modified to indicate the location of the copy of the second signal that was transmitted over communication channel $401_2$ and stored in the memory of cluster $202_{10}$ in a location $602_2$ different from location $602_1$.

In an alternative embodiment, shown in FIG. 6B, cluster $202_{10}$ may execute the instruction 603 as shown in FIG. 6B. As described above in the discussion of FIG. 6B, multiplexer 607 of intercluster crossbar 210 initially selects the signal transmitted over communication channel $401_1$. Upon detection of a failure in channel $401_1$, crossbar control field 606 is modified such that multiplexer 607 instead selects the signal transmitted over communication channel $401_2$.

In either embodiment, the resulting new first and second signals, copies of the same signal, are transmitted through cluster output $208_{10}$ and intercluster crossbar $210_3$ to processor clusters $202_8$ and $202_9$ through their respective inputs $206_8$ and $206_9$. The selection of these clusters is determined by their connections to communication channels $401_3$ and $401_4$. The first signal is transmitted from cluster $202_8$ to the destination cluster of destination emulation chip $122_2$ via output connection $208_8$ and external output connection $214_3$ of emulation chip $122_3$ communication channel $401_3$, and external input connection $212_1$ of emulation chip $122_2$. The second signal is transmitted from cluster $202_9$ to the destination cluster of destination emulation chip $122_2$ via output connection $208_9$ and external output connection $214_4$ of emulation chip $122_3$ communication channel $401_4$, and external input connection $212_2$ of emulation chip $122_2$. These two copies are then brought to the destination processor cluster and provided as alternative operands for a single instruction as described above in the discussion of FIGS. 3 and 6.

FIG. 4 depicts a general case where five clusters used in emulation chip $122_3$ are separate and distinct. One skilled in the art can easily derive simplified cases where functions of some of these clusters can be combined with functions of some other clusters. For example, one can easily derive the case where the merging function performed in cluster $202_{10}$ would instead be performed in any of clusters $202_6$ to $202_9$. The compiler may automatically choose the most advantageous option for each case.

FIG. 4 also depicts a case where there is a single emulation chip $122_3$ connected directly to both the source emulation chip $122_1$ and the destination chip $122_2$. In an alternative embodiment, there are a series of intermediate emulation chips required to obtain a connection between source chip $122_1$ and the destination chip $122_2$. In such case, the diagram of FIG. 4 can be extended to include additional intermediate emulation chips in addition to intermediate emulation chip $122_3$.

An alternative embodiment may not take advantage of merging the first and second copies of the transmitted signal in each intermediate emulation chip. In this alternative embodiment, cluster $202_{10}$ is not be required to transmit the signals from source emulation chip $122_1$ to destination emulation chip $122_2$. Instead, a first copy of a signal is transmitted from cluster $202_6$ directly to cluster $202_8$ while a second copy is transmitted from cluster $202_7$ directly to cluster $202_9$. This embodiment reduces the amount of equipment required to perform a transmission, but also reduces the probability that the emulation system will operate correctly in the presence of failures of its communication channels. Indeed, in the embodiment merging the signals in the intermediate emulation chip(s), for the system to stop being operational, it is necessary to have simultaneous failures of at least channels $401_1$ and $401_2$ or simultaneous failures of channels $401_3$ and $401_4$. In the alternative embodiment, without intermediate merging, in addition to those simultaneous failures, simultaneous failures of channels $401_1$ and $401_4$ or simultaneous failures of channels $401_2$ and $401_3$ will also cause system failure. As the number of intermediate emulation chips connecting the source emulation chip and the destination emulation chip increases, the number of additional failing combinations grows exponentially. Thus this alternative embodiment represents a trade-off between system reliability improvement and overhead needed to implement such improvement.

Figure 5:
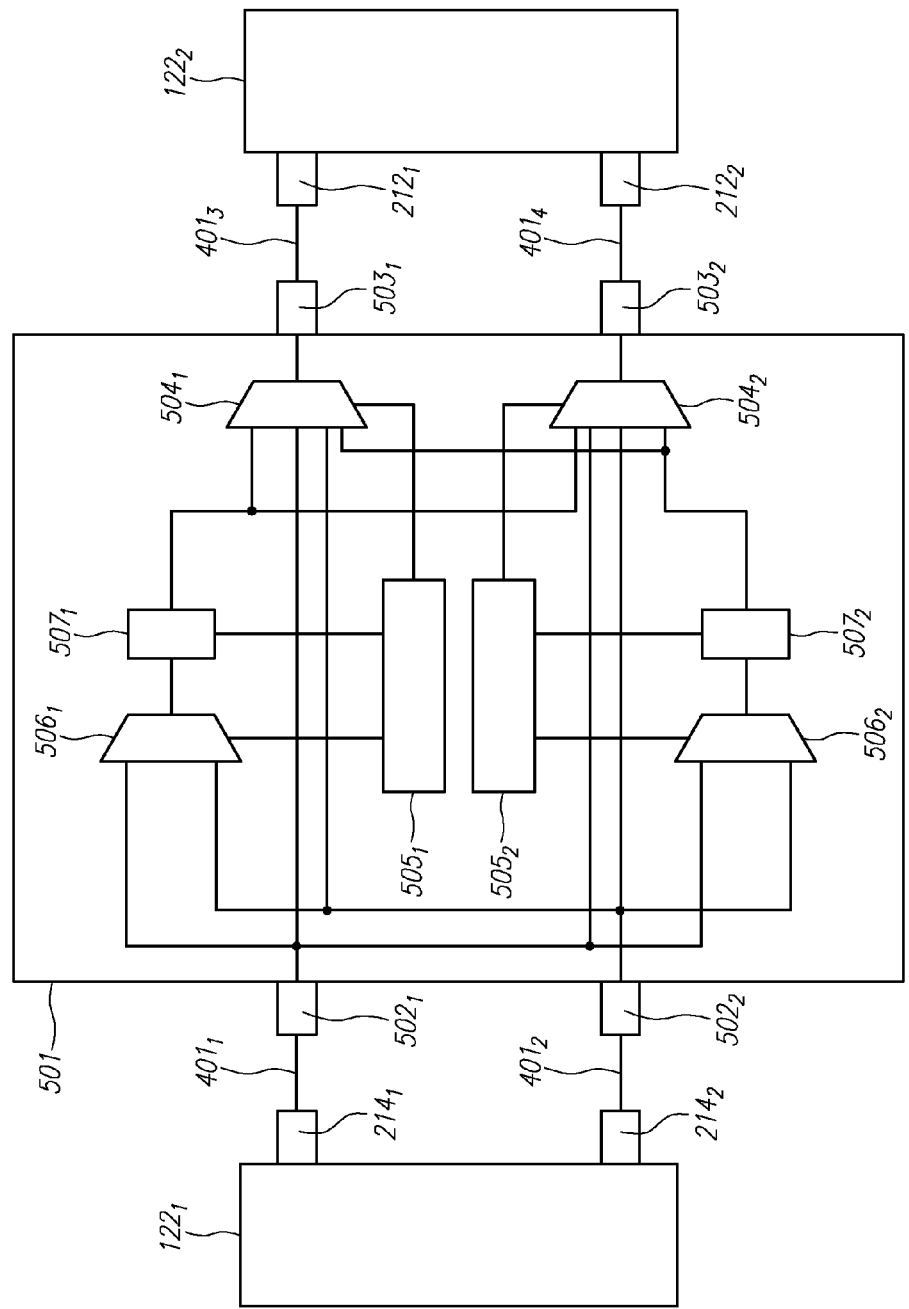
FIG. 5 is an illustration of two emulation chips, each having a plurality of connections to a programmable switch, according to one embodiment.

FIG. 5 depicts a communication scheme between processor clusters located in emulation chips $122_1$ and $122_2$ that have a switchable communication channel using programmable switch 501. FIG. 5 does not show the internals of source chip $122_1$ and destination chip $122_2$ as they are not essentially different from those shown in FIG. 3. A first copy and a second copy of a signal are generated in the source cluster in source emulation chip $122_1$. The first copy is transmitted over communication channel $401_1$ from external output connection $214_1$ to switch 501 through its external input $502_1$. The second copy is transmitted from external output connection $214_2$ external input $502_2$ of programmable switch 501 via communication channel $401_2$. Multiplexer $504_1$ can select either the first or second copy for immediate transmission to the destination emulation chip $122_2$ through output connection $503_1$, communication channel $401_3$, and destination chip input $212_1$. Likewise, multiplexer $504_2$ can select either the first or second copy for immediate transmission to the destination emulation chip $122_2$ via communication channel $401_4$.

In addition, the first or second copy can be selected by multiplexers $506_1$ and $506_2$. Multiplexer $506_1$ can select the first or second copy for intermediate storage in history buffer $507_1$. The output of history buffer $507_1$ is connected to multiplexers $504_1$ and $504_2$. Multiplexer $506_2$ can select the first or second copy for intermediate storage in history buffer $507_2$. Like history buffer $507_1$, the output of history buffer $507_2$ is connected to multiplexers $504_1$ and $504_2$. Control storage memory $505_1$ provides the selection signals for multiplexers $506_1$ and $504_1$ as well as read and write addresses for history buffer $507_1$. Likewise control storage memory $505_2$ provides the selection signals for multiplexers $506_2$ and $504_2$ and read and write addresses for history buffer $507_2$. Initially, the content of control store indicates that the first copy of a signal obtained through communication channel $401_1$ shall be transmitted (directly or through temporary storage in history buffer) through both communication channels $401_3$ and $401_4$ to destination emulation chip $122_2$. The second copy of the signal obtained through communication channel $401_2$ is discarded. Should communication channel $401_1$ be determined to be failed, the control store is modified in such a way as to transmit the second copy of a signal obtained through communication channel $401_2$ directly or through temporary storage in history buffer through both communication channels $401_3$ and $401_4$ to destination emulation chip $122_2$. This preferred embodiment may require storing a copy of a signal in both history buffers $507_1$ and $507_2$.

Alternatively, either the first copy or the second copy can be stored in either history buffer $507_1$ or history $507_2$. In this alternative, the output of the history buffer storing the copy is selected by both multiplexers $504_1$ and $504_2$ for transmission to destination emulation chip $122_2$ via communication channels $401_3$ and $401_4$ respectively.

FIG. 5 depicts a case where there is a single programmable switch 501 connected directly to both the source emulation chip $122_1$ and the destination chip $122_2$. In an alternative embodiment, there are a series of alternating programmable switches 501 and intermediate emulation chips, such as $122_3$ in FIG. 4, required to obtain a connection between source chip $122_1$ and the destination chip $122_2$. In such case, the diagram of FIG. 5 can be extended to include alternating programmable switches and emulation chips 122, in addition to the programmable switch 501 and emulation chips $122_1$ and $122_2$ of FIG. 5.

An alternative embodiment may not take advantage of merging the first and second copies of the transmitted signal in the programmable switch 501. Instead, the first copy of a signal obtained via communication channel $401_1$ is always transmitted through communication channel $401_3$ and a second copy of a signal obtained through communication channel $401_2$ is transmitted through communication channel $401_4$. The selection of either the first copy or the second copy, transmitted through a sequence of correctly functioning communication channels, only occurs in the destination chip $122_2$. While this embodiment reduces the amount of equipment required to perform a transmission, it also reduces the probability of emulation system operating correctly in presence of failures of its communication channels. Indeed, in the embodiment merging the signals in the intermediate switches, for the system to stop being operational, it is necessary to have simultaneous failures of at least channels $401_1$ and $401_2$ or simultaneous failures of channels $401_3$ and $401_4$. In the alternative embodiment, without intermediate merging, in addition to those simultaneous failures, simultaneous failures of channels $401_1$ and $401_4$ or simultaneous failures of channels $401_2$ and $401_3$ will also cause system failure. As the number of switches and intermediate emulation chips connecting the source emulation chip and the destination emulation chip increases, the number of additional failing combinations grows exponentially. Thus this alternative embodiment represents a trade-off between system reliability improvement and overhead needed to implement such improvement.

The embodiments have been described above with the assumption that for each unreliable communication channel, exactly one duplicate communication channel is allocated. This can be further generalized to a scheme where for each set of M unreliable channels, an additional set of L channels are allocated. In the case where M=1 and L>1 the embodiments described in FIGS. 3-6 will be expanded from two to L+1 copies of the same signal. However, if M>1, each of the additional L channels will additionally require an implementation of M:1 merge, performed by cluster $202_{10}$ in FIG. 4, not only in intermediate emulation chips or switches, but also in the source emulation chip $122_1$. Naturally, the reliability of the emulation system will increase with the value of L and decrease with the value of M, thus allowing a trade-off between the number of available communication channels and system reliability achieved as a result of implementation of the disclosed embodiments.

The following calculation demonstrates the improved reliability of interconnect implemented in accordance with the disclosed embodiments. Suppose that an emulation system has N communication channels without the benefit of the disclosed embodiments. The probability L that over time T this system will continue to function properly is given by the following relationship:

$$L=(1-p)^N$$

where p is a probability that a particular communication channel develops a failure over the period T. With the benefit of implementing the disclosed embodiments that use merging in intermediate emulation chips or programmable switches, we have N/2 pairs of communication channels, and a probability that a given pair will fail completely is $p^2$. The probability LV that the system will continue to function correctly over the same period T is $$LV=(1-p^2)^{N/2}$$

From the first equation, we have the following probability for a particular channel:

$$p=1-L^{1/N}$$

By substitution:

$$LV=(1-(1-L^{1/N})^2)^{N/2}$$

Assuming that an emulation system has fifty thousand communication channels (N=50,000) and that L=0.5 (meaning that the period T is in fact a mean time between failures of a system built without the benefit of present invention), then LV=0.9999952. This means that the system will function properly with probability of 99.99952% after the average period of time in which the system built without the benefit of the disclosed embodiments will fail.

Figure 7:
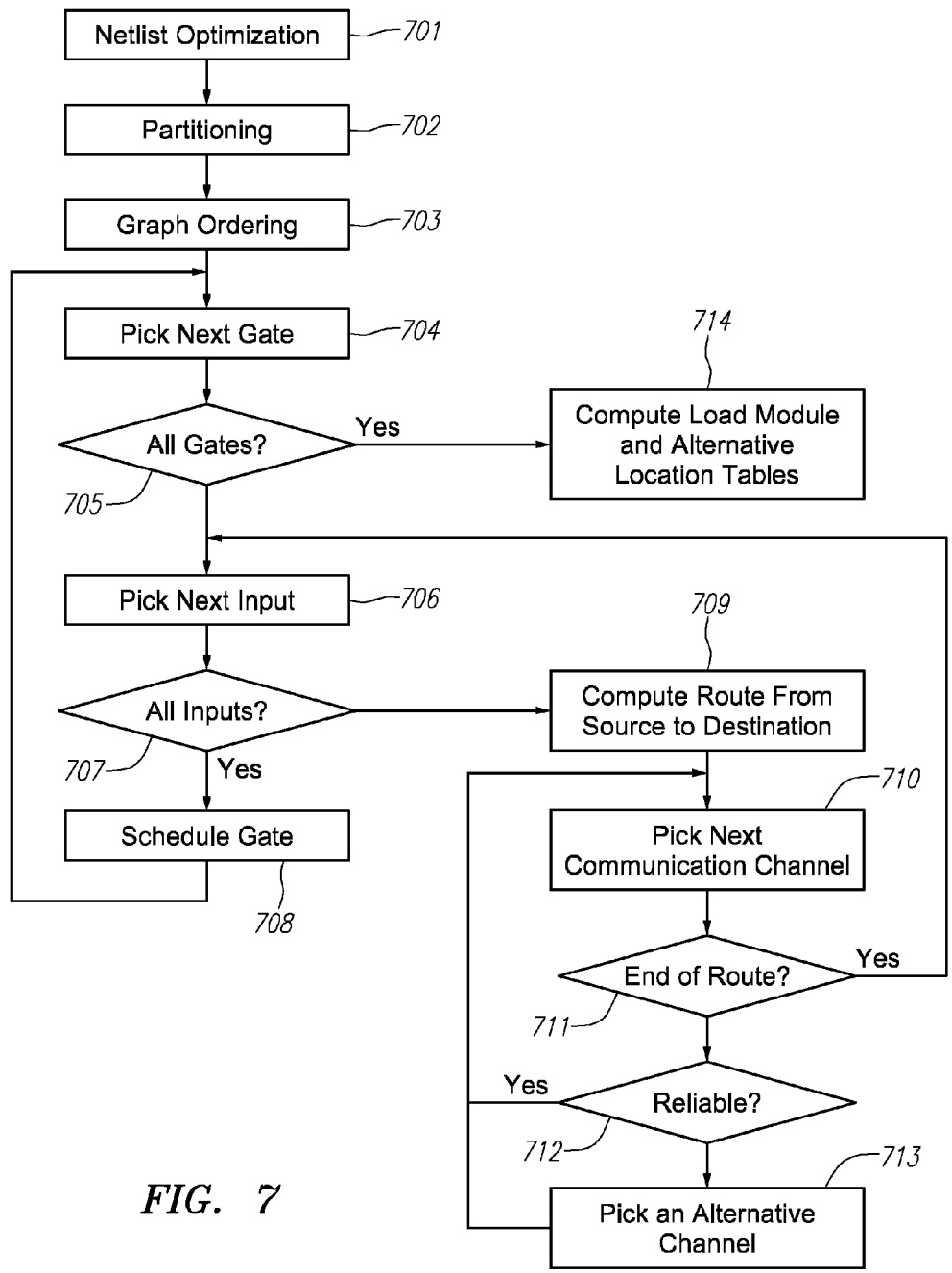
FIG. 7 illustrates an exemplary flow of an emulation system compiler.

FIG. 7 depicts a flow diagram of emulation system compiler 114, which runs on the CPU 106 of workstation 105. It includes the step of netlist optimization 701 wherein the original design netlist is reduced by applying techniques known in the art such as constant propagation, technology mapping, common expression elimination, etc. This step is generally followed by partitioning 702 wherein each logic gate is assigned to a processor cluster such that the amount of transfers of data between clusters is minimized. Step of graph ordering 703 orders gates in such a way that every gate is positioned later than gates that produce its input signals. Steps 704 and 705 form a loop that enumerates all gates in order determined in step 703. Steps 706 and 707 form a loop that enumerates all inputs of a given gate. For each input, step 709 is performed wherein an optimal route, possibly comprised of the plurality of communication channels, is found to deliver a signal from its source to the destination cluster where the gate is located by partitioning step 702. Steps 710 and 711 form a loop over all communication channels (if any) that form a route from the source cluster to the destination cluster. For each communication channel, query 712 is performed to determine if the communication channel is reliable or requires measures to improve reliability. This determination is made based on the physical nature of the communication channel and on the user's desired trade-off between reliability and resource allocation. For example, it can be determined that all communication channels inside a multi-chip module are reliable, and thus do not require reliability improvements, while the channels implemented by printed circuit board wires or by cables are unreliable. If a communication channel is deemed unreliable, an alternative communication channel is picked and a copy of the signal is routed on that alternative channel. The location of the copy of a signal is noted in a special table next to the identifier for the channel over which the copy of the signal has been transferred. Once all the inputs are routed, the gate itself is scheduled in step 708 in such a way that all input signals and their alternative copies should be available in the same cluster before the output of the gate itself is computed. Once all gates are processed, a computed set of processor instructions is produced along with the table of alternative signal locations in step 714.

In one preferred embodiment of a compiler 114 assumes that as of the time of compilation, the emulation system does not contain failed communication channels. An alternative embodiment accounts for known failed channels at the time of compilation. In this embodiment, step 713 of FIG. 7 may fail if the alternative channel has failed. Two strategies are possible and can be picked by the user. A more aggressive strategy will leave this channel without duplication thereby reducing the overall system reliability. A more conservative strategy will consider this route unavailable and return to step 709 to pick a different route.

Figure 6:
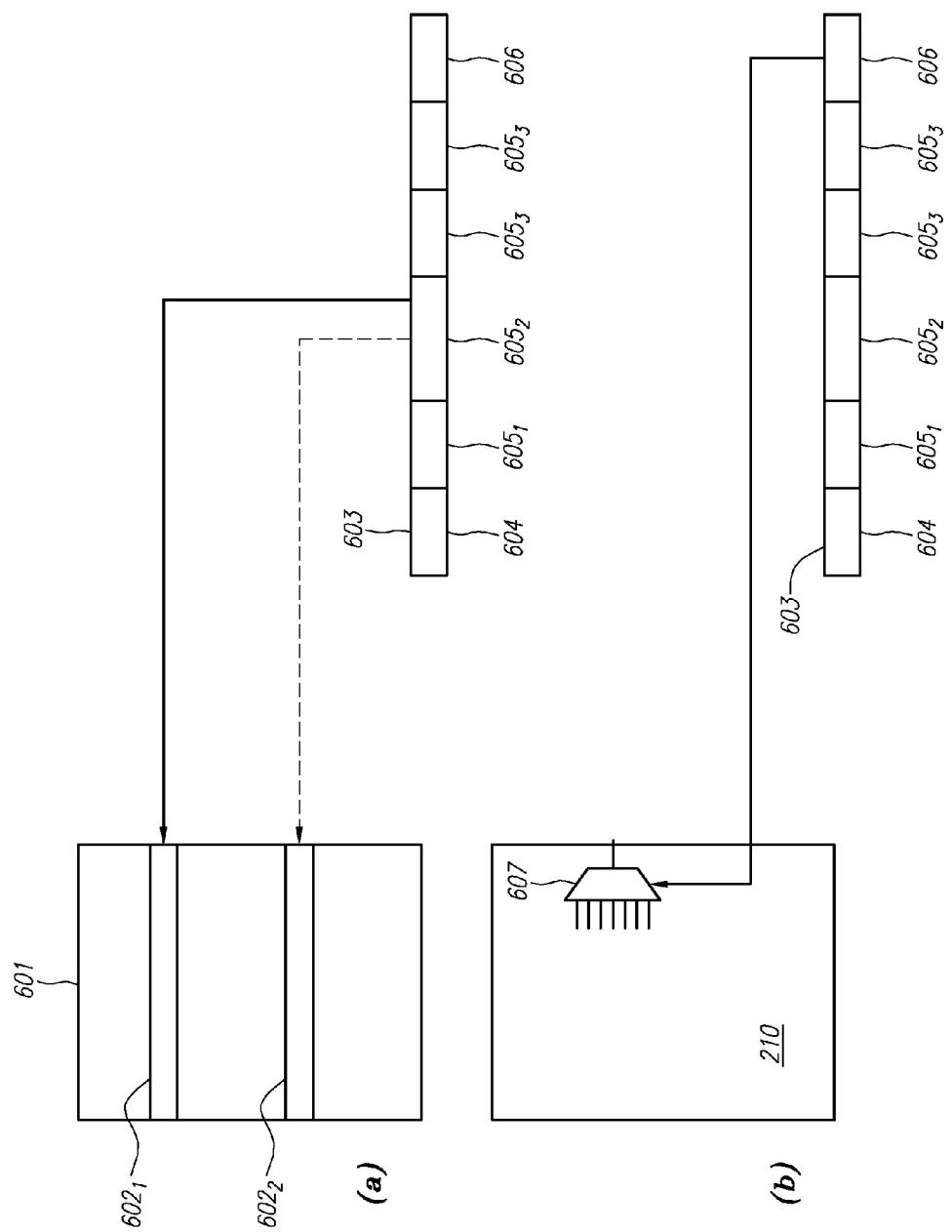
FIGS. 6A and 6B illustrate a dynamically modifiable instruction of an emulation processor using two available copies of a signal crossing communication channels, according to one embodiment.
Figure 8:
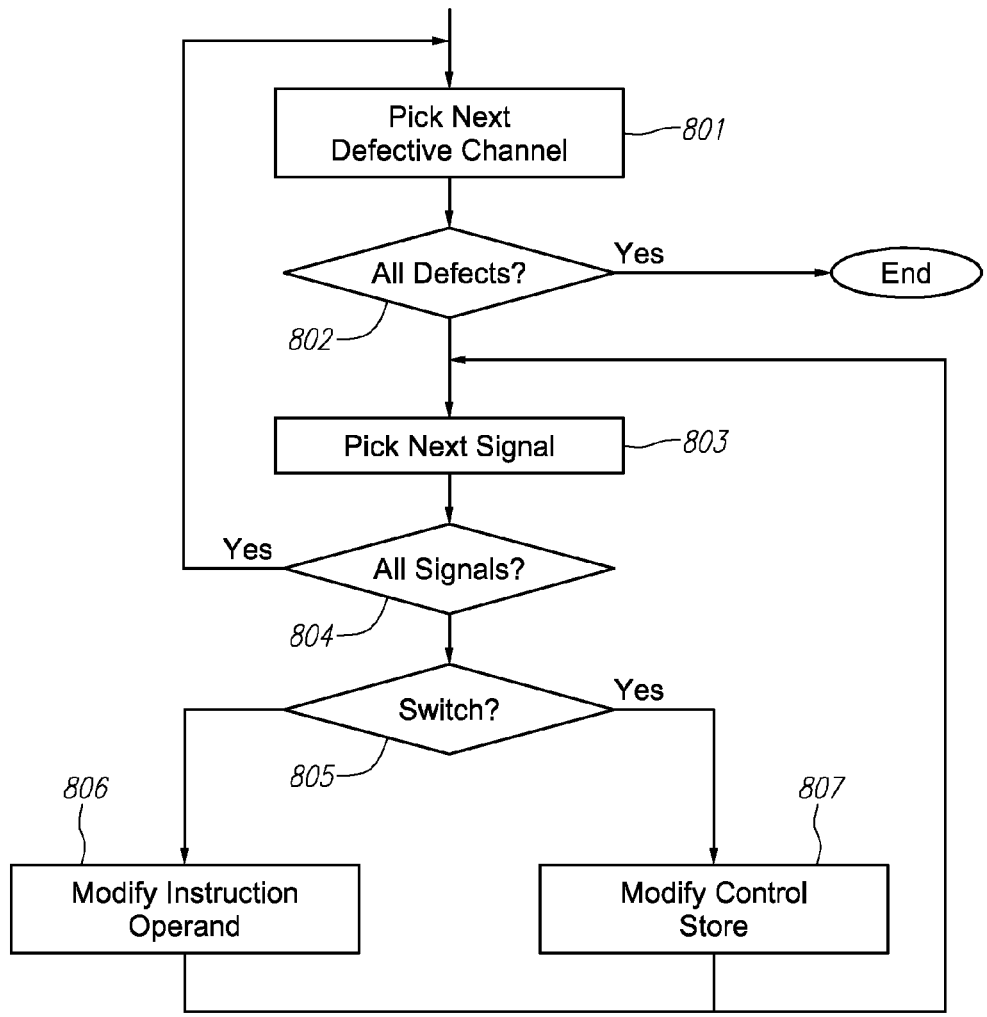
FIG. 8 illustrates an exemplary flow of an emulation support software.

FIG. 8 depicts a flow diagram of emulation support software, which runs on the CPU 106 of workstation 105. Its function is to modify the load module produced by the compiler to bypass the failed channels. To do this, it executes steps 801 and 802 that form the loop enumerating all failed channels known at the time of emulation. For each such channel, steps 803 and 804 form a loop enumerating all signals transmitted over this channel during emulation. For each such signal, depending on the type of endpoint of the channel (test 805) either step 806 or step 807 are executed. Step 806 is executed if the end point of communication channel is an emulation chip, for example emulation chip $122_3$ as shown in FIG. 4. This step requires replacement of operand address in any instruction that uses this signal with the address of an alternative location as shown in FIG. 6. If the end point of a channel is a switch, step 807 is executed that modifies the contents of switch control store to transmit the values of an alternative copy of a signal as shown in FIG. 5.

A method and apparatus for redundant communication channels to increase the reliability of interconnect in an emulation system is disclosed. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:
1. A computer-implemented method, comprising:
(a) receiving a first copy of data at a first processor cluster of an emulation system over a first communication channel from a second processor cluster;
(b) receiving a second copy of said same data at said first processor cluster over a second communication channel from said second processor cluster;
(c) storing said first copy of data in a memory of said first processor cluster;
(d) storing said second copy of data in said memory of said first processor cluster;

(e) examining a list of failed communication channels for the emulation system to find an entry for said first communication channel;

(f) modifying a first instruction stored in said memory of said first processor cluster, wherein said first instruction controls the selection of one of said first copy of data and said second copy of said same data;

(g) receiving a third copy of data at said second processor cluster over a third communication channel from a third processor cluster;

(h) receiving a fourth copy of data at said second processor cluster over a fourth communication channel from said third processor cluster;

(i) storing said third copy of said same data in a memory of said second processor cluster;

(j) storing said fourth copy of data in said memory of said second processor cluster;

(k) modifying a second instruction stored in said memory of said second processor cluster, wherein said first instruction controls the selection of one of said third communication channel and said fourth communication channel; and (l) copying one of said third copy of said data and said fourth copy of said data to create said first and second copies of said data.

2. The computer-implemented method of claim 1, wherein said first instruction addresses the memory location of one of said first and second copies of said data, wherein said first instruction is modified to address the memory location of the copy of data received over said second communication channel.

3. The computer-implemented method of claim 1, wherein said first instruction comprises a control field selecting one of said first communication channel and said second communication channel inputs to a multiplexer.

4. The computer-implemented method of claim 1, wherein said second instruction addresses the memory location of one of said third and fourth copies of said data, wherein said second instruction is modified to address the memory location of the copy of data received over one of said third communication channel and said fourth communication channel.

5. The computer-implemented method of claim 1, wherein said second instruction comprises a second control field selecting one of said third communication channel and said fourth communication channel inputs to a second multiplexer.

6. A computer-implemented method of compiling an integrated circuit design, comprising:
   selecting a source processor cluster of an emulation system;
   selecting a destination processor cluster of said emulation system;
   selecting a first sequence of communication elements of said emulation system, including a first set of one or more communication channels, said first sequence of communication elements connecting said source processor cluster to said destination processor cluster;
   identifying a second sequence of communication elements of an emulation system, including a second set of one or more communication channels, said second sequence of communication elements connecting said source processor cluster to a destination processor cluster;
   scheduling a transfer of a first copy of data over said first sequence of communication elements and a second copy of the same data over said second sequence of communication elements, until both the first and second copies of the same data reside in separate locations in a memory of the destination processor cluster; and
   generating an instruction that uses one of the transferred first and second copies of the same data after both Copies have been scheduled to arrive at said memory of said destination processor cluster,
   wherein said first sequence of communication elements comprises a first communication channel, a third communication channel, and at first programmable switch, said first programmable switch to receive said first copy of data from said first communication channel and to transmit said first copy of data to said third communication channel; and
   wherein said second sequence of communication elements comprises a second communication channel, a fourth communication channel, and said programmable switch, said programmable switch to receive a second copy of data from said second communication channel and to transmit said second copy of data to said fourth communication channel.

7. The computer-implemented method of compiling an integrated circuit design of claim 6:
   wherein said first sequence of communication elements comprises a first communication channel, a third communication channel, and a first intermediate processor cluster, said first intermediate processor to receive said first copy of data from said first communication channel and to transmit said first copy of data to said third communication channel; and
   wherein said second sequence of communication elements comprises a second communication channel, a fourth communication channel, and a second intermediate processor cluster, said second intermediate processor to receive a second copy of data from said second communication channel and to transmit said second copy of data to said fourth communication channel.

8. The computer-implemented method of compiling an integrated circuit design of claim 6, wherein said first sequence of communication elements comprises a first communication channel, a third communication channel, and a first intermediate processor cluster to receive a third copy of data from said first communication channel and to transmit said first copy of data to said third communication channel, and wherein said second sequence of communication elements comprises a second communication channel, a fourth communication channel, and a second intermediate processor cluster to receive a fourth copy of data from said second communication channel and to transmit said second copy of data to said fourth communication channel, further comprising the steps of:
   scheduling a transfer of a third copy of data over said third communication channel and a transfer of a fourth copy of the same data over said fourth communication channel, until both the third and fourth copies of data reside in separate locations in memory space of the same intermediate processor cluster; and
   scheduling the selection of one of the third and fourth copies of data for copying to create said first and second copies of data after both the third and fourth copies have been scheduled to arrive at said intermediate processor cluster.

9. An emulation interconnect apparatus of an emulation system, comprising:
   a plurality of emulation chips haying processor clusters;
   a first processor cluster of a first emulation chip;
   a second processor cluster of a second emulation chip;

a first communication channel for carrying a first copy of data from said first processor cluster for receipt by said second processor cluster;

a second communication channel for carrying a second copy of said same data from said first processor cluster for receipt by said second processor cluster;

a memory of said second processor cluster to store said first copy of data at a first address, to store said second cow of said same data at a second address, and to store an instruction at a third address in said memory, wherein said instruction controls the selection of one of said first copy of data and said second copy of said same data;

a third processor cluster of a third emulation chip for receiving said first copy of data from said first processor cluster over a first portion of said first communication channel and for transmitting said first copy of data to said second processor cluster over a second portion of said first communication channel; and a fourth processor cluster of said third emulation chip for receiving said second copy of said same data from said first processor cluster over a first portion of said second communication channel and liar transmitting said second copy of said same data to said second processor cluster over a second portion of said first communication channel.

10. The emulation interconnect apparatus of claim 9, further comprising:

a third processor cluster of a third emulation chip;

a third communication channel for carrying a first copy of a second data from said first processor duster for receipt by said second processor cluster;

a fourth communication channel for carrying a second copy of the same second data from said third processor cluster for receipt by said first processor cluster; and a memory of said third processor duster for storing said received first copy of the second data at a first address of the memory and the second copy of the same second data and a second address of the memory, and for storing a second instruction at a third address in said memory, wherein the second instruction selects one of the first copy of said second data and the second copy of the same second data;

and wherein each duplicate signal of said set of duplicate signals transmitted from said first processor cluster is as copy of one duplicate signal of said second set of duplicate signals stored in said first processor memory.

11. The emulation interconnect apparatus of claim 9, further comprising:

a multiplexer to select one of the first copy of data at the first address of the memory and the second copy of the same data at the second address, and to output a selected copy of the data, wherein the instruction comprises a selection bit for the multiplexer.

12. The emulation, interconnect apparatus of claim 9, wherein the instruction further comprises one of said first address and said second address.

13. A computer-readable non-transitory storage medium having stored thereon a plurality of instructions, said plurality of instructions when executed by a computer, cause said computer to perform:

(a) receiving a first copy of data at a first processor cluster of an emulation system over a first communication channel from a second processor cluster;

(b) receiving a second copy of said same data at said first processor cluster over a second communication channel from said second processor cluster;

(c) storing said first any of data in a memory of said first processor cluster;

(d) storing said second copy of data in said memory of said first processor cluster, (e) examining a list of failed communication channels for the emulation system to find an entry for said first communication channel;

(f) modifying, a first instruction stored in said memory of said first processor cluster, wherein said first instruction controls the selection of one of said first copy of data and said second copy of said same data;

(g) receiving a third copy of data at said second processor cluster over a third communication channel from a third processor cluster;

(h) receiving a fourth copy of data at said second processor cluster over a fourth communication channel from said third processor cluster;

(i) storing said third copy of said same data in a memory of said second processor cluster;

(j) storing said fourth copy of data in said memory of said second processor cluster;

(k) modifying a second instruction stored in said memory of said second processor cluster, wherein said first instruction controls the selection of one of said third communication channel and said fourth communication channel; and (l) copying one of said third copy of said data and said fourth copy of said data to create said first and second copies of said data.

14. The computer-readable non-transitory storage medium of claim 13, wherein said first instruction addresses the memory location of one of said first and second copies of said data, wherein said first instruction is modified to address the memory location of the copy of data received over said second communication channel.

15. The computer-readable non-transitory storage medium of claim 13, wherein said first instruction comprises a control field selecting one of a plurality of said first communication channel and said second communication channel inputs to as multiplexer.

16. The computer-readable non-transitory storage medium of claim 13, wherein said second instruction addresses the memory location of one of said third and fourth copies of said data, wherein said second instruction is modified to address the memory location of the copy of data received over one of said third communication channel and said fourth communication channel.

17. A computer-readable non-transitory storage medium having stored thereon a plurality of instructions, said plurality of instructions when executed by a computer, cause said computer to perform:

selecting a source processor cluster of an emulation system;

selecting a destination processor cluster of said emulation system;

selection a first sequence of communication elements of said emulation system, including a first set of one or more communication channels, said first sequence of communication elements connecting said source processor cluster to said destination processor cluster;

identifying a second sequence of communication elements of an emulation system, including a second set of one or more communication channels, said second sequence of communication elements connecting said source processor cluster to a destination processor cluster;

scheduling a transfer of a first copy of data over said first sequence of communication elements and a second copy of the same data over said second sequence of communication elements, until both the first and second copies of the same data reside in separate locations in a memory of the destination processor cluster; and generating an instruction that uses one of the transferred first and second copies of the same data after both copies have been scheduled to arrive at said memory of said destination processor cluster, wherein said first sequence of communication elements comprises a first communication channel, a third communication channel, and a first programmable switch, said first programmable switch to receive said first copy of data from said first communication channel and to transmit said first copy of data to said third communication channel, and wherein said second sequence of communication elements comprises a second communication channel, a fourth communication channel, and said programmable switch, said programmable switch to receive a second copy of data from said second communication channel and to transmit said second copy of data to said fourth communication channel.

18. The computer-readable non-transitory storage medium of claim 17, wherein said first sequence of communication elements comprises a first communication channel, a third communication channel, and a first intermediate processor cluster, said first intermediate processor to receive said first copy of data from said first communication channel and to transmit said first copy of data to said third communication channel, and wherein said second sequence of communication elements composes a second communication channel, a fourth communication channel, and a second intermediate processor cluster, said second intermediate processor to receive a second copy of data from said second communication channel and to transmit said second copy of data to said fourth communication channel.

19. The computer-readable non-transitory storage medium of claim 17, wherein said first sequence of communication on elements comprises a first communication channel, a third communication channel, and a first intermediate processor cluster to receive a third copy of data from said first communication channel and to transmit said first copy of data to said third communication channel, and wherein said second sequence of communication elements comprises a second communication channel, a fourth communication channel, and a second intermediate processor cluster to receive a fourth copy of data from said second communication channel and to transmit said second copy of data to said fourth communication channel, and further causing said computer to perform:

scheduling a transfer of a third copy of data over said third communication channel and a transfer of a fourth copy of the same data over said fourth communication channel, until both the third and fourth copies of data reside in separate locations in memory space of the same intermediate processor cluster; and scheduling the selection of one of the third and fourth copies of data for copying to create said first and second copies of data after both the third and fourth copies have been scheduled to arrive at said intermediate processor cluster.

20. The computer-implemented method of claim 1, wherein steps (g) through (l) of the method are performed before steps (a) through (f).

21. The computer-readable non-transitory storage medium of claim 17, wherein the computer performs steps (g) through (l) before steps (a) through (f).

\* \* \* \* \*